United States Patent
Tao et al.

[19]

[11] Patent Number: 5,925,575
[45] Date of Patent: Jul. 20, 1999

[54] DRY ETCHING ENDPOINT PROCEDURE TO PROTECT AGAINST PHOTOLITHOGRAPHIC MISALIGNMENTS

[75] Inventors: Hun-Jan Tao; Chia-Shiung Tsai, both of Hsin-chu, Taiwan

[73] Assignee: Taiwan Semiconductor Manufacturing Company, Ltd., Hsin-Chu, Taiwan

[21] Appl. No.: 08/940,002

[22] Filed: Sep. 29, 1997

[51] Int. Cl.$^6$ .................................................... H01L 21/00
[52] U.S. Cl. .............................. 438/692; 216/38; 216/85; 438/14; 438/9; 438/723; 438/743; 438/719
[58] Field of Search ..................... 216/38, 39, 60, 216/67, 79, 85, 88; 438/8, 9, 14, 16, 692, 719, 723, 743, 753, 758

[56] References Cited

U.S. PATENT DOCUMENTS

| | | | |
|---|---|---|---|
| 5,200,023 | 4/1993 | Gifford et al. | 156/626 |
| 5,234,868 | 8/1993 | Cote | 438/692 X |
| 5,521,411 | 5/1996 | Chen et al. | 257/344 |
| 5,591,300 | 1/1997 | Schiller | 156/626.1 |
| 5,863,828 | 1/1999 | Snyder | 438/692 X |
| 5,872,043 | 2/1999 | Chen | 438/692 X |

*Primary Examiner*—William Powell
*Attorney, Agent, or Firm*—George O. Saile; Stephen B. Ackerman

[57] ABSTRACT

A process for forming a planarized, insulator, or silicon oxide filled shallow trench has been developed. The process features a hybrid planarization procedure, comprised of an initial dry etching cycle, used to remove all but about 100 to 500 Angstroms of silicon oxide, from subsequent device regions, or regions outside the insulator filled trench. Silicon oxide residing on the insulator filled trench is protected by a photoresist shape. A final chemical mechanical polishing procedure is than employed to remove both the silicon oxide, on the insulator filled shallow trench, as well as removing the remaining silicon oxide on silicon nitride, in subsequent device regions. An endpoint monitoring procedure allows the detection of the remaining 100 to 500 Angstroms of silicon oxide, on silicon nitride. This allows the procedure to be terminated at this stage, thus avoiding gouging or trenching phenomena of insulator in the shallow trench, which can occur due to misalignment of the masking photoresist shape to the underlying insulator filled trench.

18 Claims, 4 Drawing Sheets

DRY ETCHING ENDPOINT PROCEDURE TO PROTECT AGAINST PHOTOLITHOGRAPHIC MISALIGNMENTS

BACKGROUND OF THE INVENTION (1) Field of the Invention

The present invention relates to processes used to fabricate semiconductor devices, and more specifically to a method used to determine endpoint of an insulator dry etching procedure, used to create planar insulator filled shallow trenches.

(2) Description of Prior Art

The semiconductor industry is continually striving to improve device performance, while still attempting to reduce the manufacturing cost of specific metal oxide semiconductor field effect transistor, (MOSFET), devices. The ability to create MOSFET devices with sub-micron features, or micro-miniaturization, has allowed these objectives to be realized. Devices with sub-micron features exhibit less performance degrading resistances and capacitances, thus improving device performance. In addition devices with sub-micron features, allow smaller semiconductor chips to be obtained, still possessing equal, or greater, circuit densities than counterparts, fabricated using larger features. The use of smaller chips allow a greater number of chips to be realized from a specific size starting semiconductor substrate, thus reducing the manufacturing cost of a specific chip.

The realization of semiconductor devices, with sub-micron features, has been mainly attributed to advances in specific semiconductor fabrication disciplines, used in the manufacture of sub-micron MOSFET devices, such as photolithography and dry etching. The use of more advanced exposure cameras, as well as the use of more sensitive photoresist materials, have allowed sub-micron features to be routinely obtained in photoresist layers. In addition the development of advanced dry etching tools and procedures, have allowed the sub-micron images in overlying photoresist layers, to be successfully transferred to underlying materials, used in the manufacture of sub-micron MOSFET devices. However the use of dry etching procedures demands adequate etch rate selectivity between the material being etched, and the underlying material, used as an etch stop layer. For example if silicon oxide, used to fill a shallow trench, is to be removed from the top surface of a silicon nitride layer, in regions outside the shallow trench, or in subsequent device regions, a dry etch chemistry offering higher removal rates of silicon oxide, compared to silicon nitride, is needed to prevent silicon nitride erosion at the completion of the silicon oxide removal. In addition if a photoresist shape, defining the region of silicon oxide to be removed, is misaligned, silicon oxide in the shallow trench can be exposed to a silicon oxide overetch procedure, used to insure complete removal of silicon oxide from the surface of silicon nitride. This would result in a non-planar, insulator filled trench.

This invention will describe a method for determining an early and sharp endpoint, for a dry etching procedure, used for silicon oxide. This invention will allow the dry etching procedure used for silicon oxide, to terminate when between about 100 to 500 Angstroms of silicon oxide still remains on an underlying silicon nitride layer. The early endpoint detection removes the possibility of etching underlying silicon nitride, for cases in which poor etch rate selectivity between silicon oxide and silicon nitride exist, while also offering protection from etching of silicon oxide, in the shallow trench, for cases of misalignment. The remaining 100 to 500 Angstroms of silicon oxide are removed during a subsequent planarizing, chemical mechanical polishing procedure. Prior art, such as Gifford, et al, in U.S. Pat. No. 5,200,023, describe a method for measuring the progress of a dry etching procedure, however an infrared thermographic method is employed for that invention.

SUMMARY OF THE INVENTION

It is an object of this invention to remove silicon oxide from an underlying silicon nitride layer, using dry etching procedures.

It is another object of this invention to use a monitoring procedure, for the dry etching procedure, that indicates the presence of between about 100 to 500 Angstroms of silicon oxide remaining on an underlying silicon nitride layer.

It is still another object of this invention to use a chemical mechanical polishing procedure, after use of the dry etching procedure, to obtain a planar top surface for a silicon oxide filled shallow trench.

In accordance with the present invention a process for forming a planarized, insulator filled shallow trench is described, using a dry etching approach, featuring a monitoring procedure allowing dry etching to terminate with between 100 to 500 Angstroms of silicon oxide remaining on an underlying silicon nitride layer, followed by a planarizing chemical mechanical polishing procedure. A silicon nitride layer is deposited on a semiconductor substrate, followed by photolithographic and reactive ion etching procedures, used to form a shallow trench in silicon nitride and the semiconductor substrate. A silicon oxide layer is deposited, completely filling the shallow trench, followed by the creation of a photoresist shape on silicon oxide, in a region overlying the silicon oxide shallow trench. A dry etching procedure is used to remove all but between about 100 to 500 Angstroms of silicon oxide, from the top surface of silicon nitride, using an early endpoint detection procedure. After removal of the photoresist shape, a chemical mechanical polishing procedure is used create a planarized, silicon oxide filled shallow trench by removal of the silicon oxide, overlying the silicon oxide filled shallow trench, previously covered by the photoresist shape, and removal of the remaining 100 to 500 Angstroms of silicon nitride, on the top surface of the silicon nitride layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

A method of creating a planarized, insulator filled shallow trench, using a dry etching procedure, featuring a monitoring procedure allowing the dry etch procedure of the insulator layer to be terminated with about 100 to 500 Angstroms of insulator still remaining on an underlying silicon nitride layer, than followed by a chemical mechanical polishing procedure, will now be described. The planarized, insulator filled shallow trench can be used for isolation regions for metal oxide semiconductor field effect transistors, (MOSFET), currently being manufactured. Therefore this invention will concentrate on the dry etching, and dry etching monitoring procedure, used for removal of insulator layer from regions outside the shallow trench, or in subsequent device regions.

Figure 1:
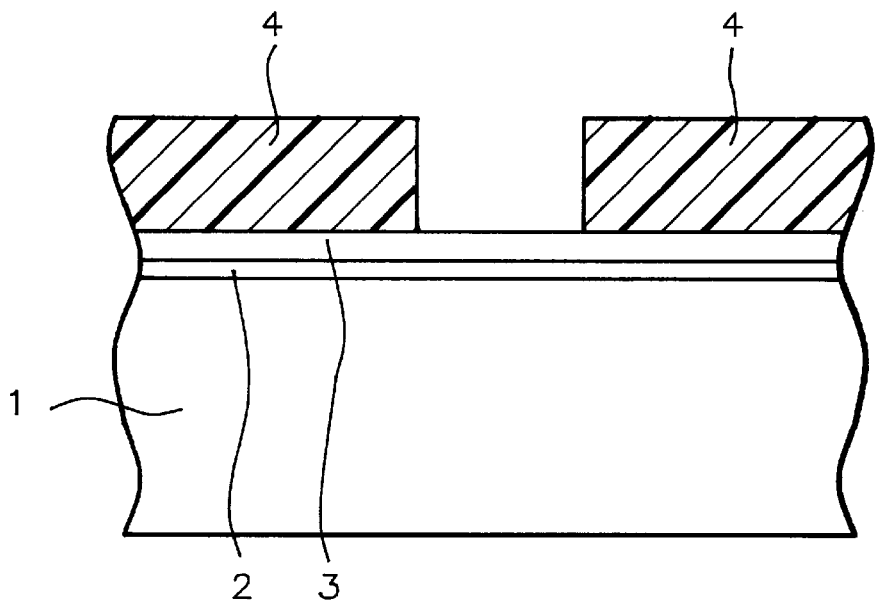
FIGS. 1–2, schematically, in cross-sectional style, showing the early stages of shallow trench formation.

A semiconductor substrate 1, comprised of P type, single crystalline silicon, exhibiting a <100> crystallographic orientation, is used and shown schematically in FIG. 1. A pad insulator layer 2, of silicon oxide, is thermally grown on semiconductor substrate 1, to a thickness between about 50 to 150 Angstroms. A layer of silicon nitride 3, is next deposited using low pressure chemical vapor deposition, (LPCVD), or plasma enhanced chemical vapor deposition, (PECVD), procedures, to a thickness between about 1000 to 2000 Angstroms. A photoresist shape, (OD), 4, with an opening defining a subsequent shallow trench, while protecting a subsequent active device region, is formed on silicon nitride layer 3. This is schematically shown in FIG. 1.

Figure 2:
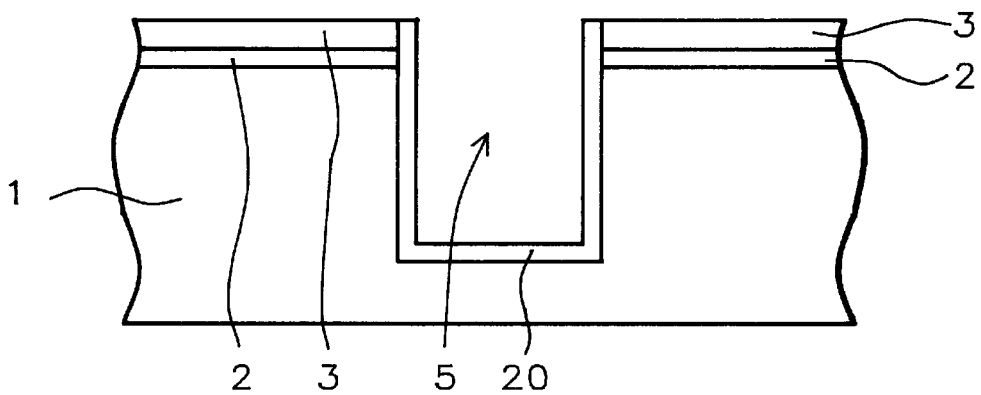

Reactive ion etching, (RIE), procedures, are used to form shallow trench 5, using photoresist shape 4, as a mask, and using $CHF_3$—$CF_4$—Ar—$O_2$ as an etchant for silicon nitride layer 3, and for pad insulator layer 2, and using HBr—$Cl^2$ as an etchant for semiconductor substrate 1. The depth of shallow trench 5, is between about 3000 to 4000 Angstroms, while the width of shallow trench 5, is between about 4000 to 5000 Angstroms. Photoresist shape 4, is removed via plasma oxygen ashing and careful wet cleans, followed by the formation of an silicon oxide trench liner layer 6, at a thickness between about 250 to 550 Angstroms, on the exposed silicon surfaces of shallow trench 5, via thermal oxidation procedures. FIG. 2, schematically shows the result of these processes.

Another silicon oxide layer 7, is next deposited, completely filling shallow trench 5, and also depositing on the top surface of silicon nitride layer 3. Silicon oxide layer 7, is deposited using LPCVD, PECVD, or sub-atmospheric chemical vapor deposition, (SACVD), to a thickness between about 5000 to 7000 Angstroms, shown schematically in FIG. 3a. Silicon oxide layer 7, results in depression 6, in the center of shallow trench 5, due to the convergence of the depositing silicon oxide layers 7, on the sides of shallow trench 5. If only a dry etching procedure were used to remove silicon oxide 7, from the top surface of silicon nitride layer 3, depression 6, will be transferred to the silicon oxide fill, in shallow trench 5, resulting in an non-planarized insulator filled trench. If only a chemical mechanical polishing, (CMP), procedure were used to remove unwanted silicon oxide from the top surface of silicon nitride layer 3, dishing or unwanted removal of silicon oxide may occur in the shallow trench, again resulting in a non-planar, insulator filled shallow trench. Therefore a hybrid procedure, comprised of an initial dry etching cycle, used to remove silicon oxide from the top surface of silicon nitride, is first used, with portions of silicon oxide overlying the shallow trench, protected by a photoresist shape. This is followed by removal of the photoresist shape, and removal of the remaining silicon oxide, overlying the insulator filled shallow trench, via a CMP procedure. The silicon oxide to be protected during the dry etching procedure is protected by photoresist shape, ODR, 8a. Photoresist shape 8a, is the reverse tone of photoresist shape 4, where the opening in photoresist shape 4, previously used to open shallow trench 5, is now the mask protecting silicon oxide layer 7, overlying the shallow trench, from the initial dry etching cycle.

Figure 3A:
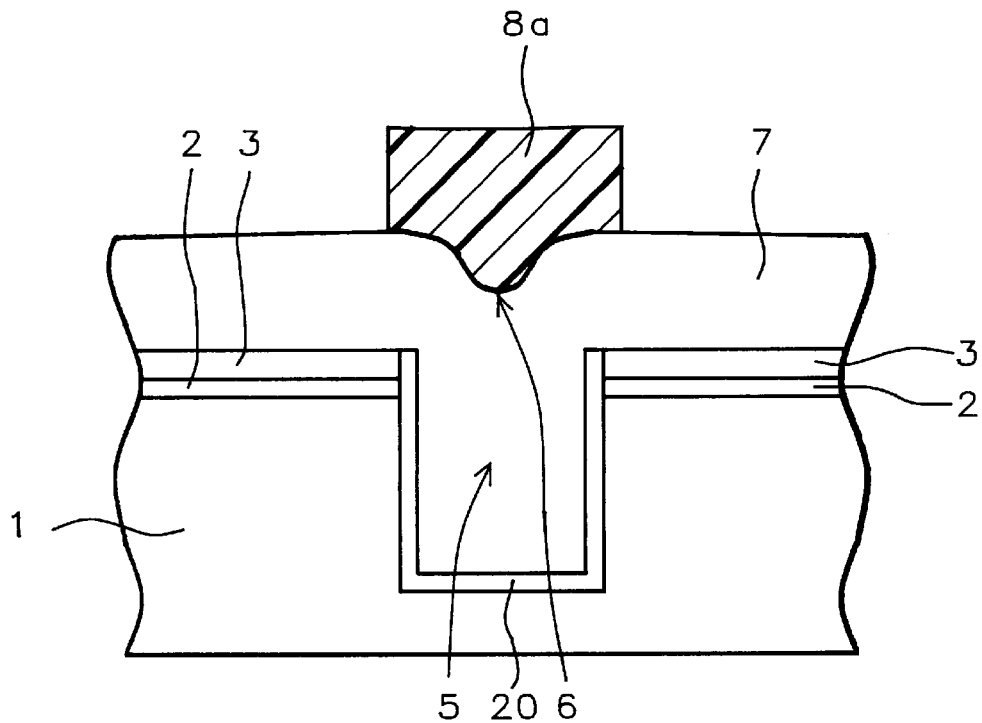
FIG. 3a, schematically in cross-sectional style, showing a photoresist shape, properly aligned to an underlying shallow trench, with the photoresist shape used to allow removal of unwanted insulator from regions outside the shallow trench.
Figure 3B:
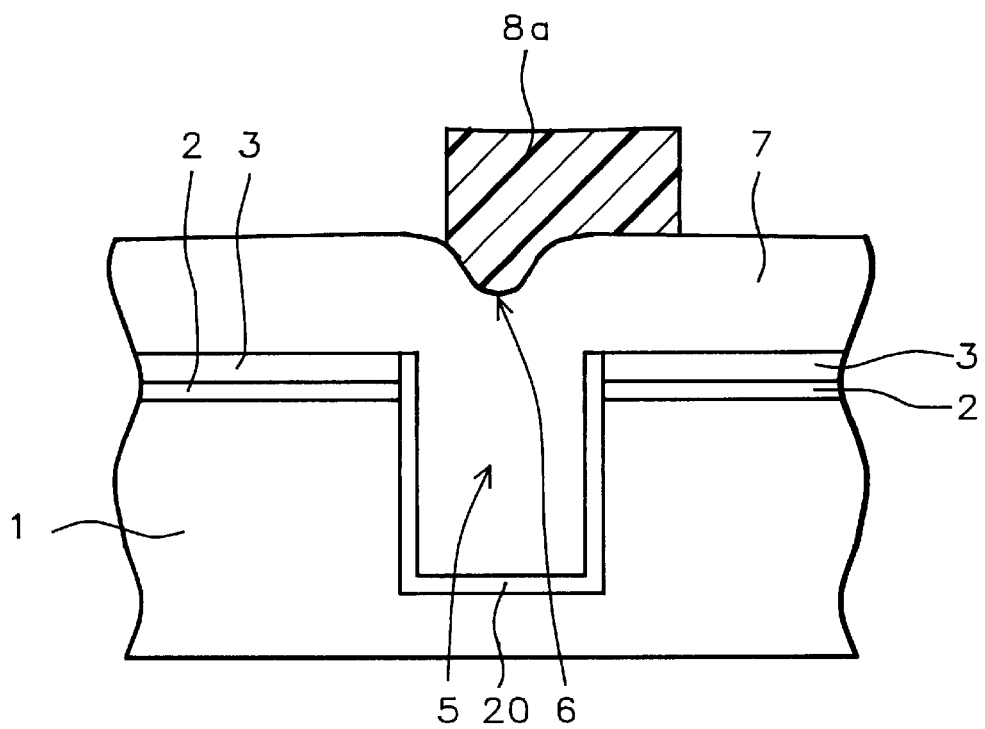
FIG. 3b, schematically, in cross-sectional style, showing a photoresist shape, misaligned to an underlying shallow trench, with the photoresist shape used to allow removal of unwanted insulator from regions outside the shallow trench.
Figure 4A:
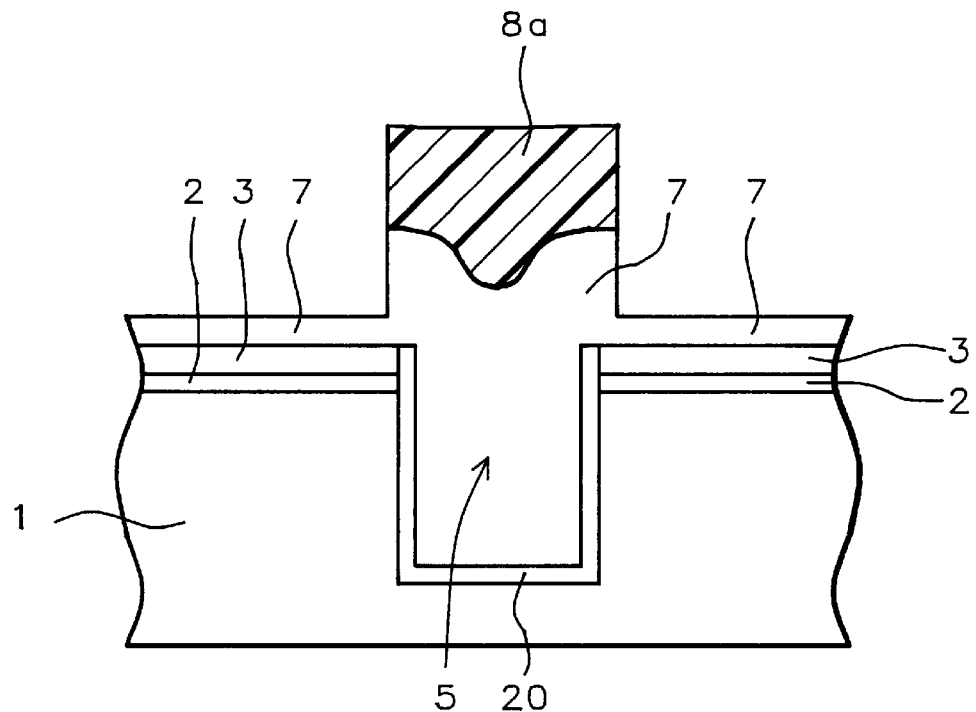
FIGS. 4a and 4b, schematically, in cross-sectional style, showing the dry etching of insulator, in regions not covered by the properly aligned photoresist shape of FIG. 3a, or in regions not covered by the misaligned photoresist shape, of FIG. 3b, terminating the dry etching procedure with about 100 to 500 Angstroms of insulator remaining on underlying silicon nitride.
Figure 4B:
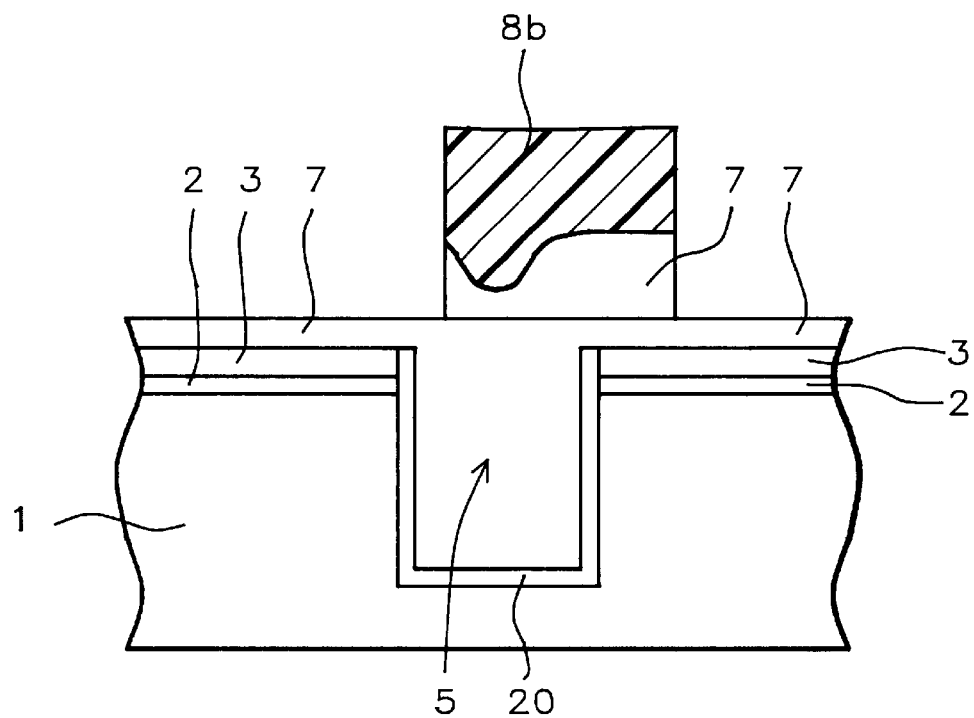

Photoresist shape 8a, shown schematically in FIG. 3a, is perfectly aligned to shallow trench 5, however misalignment may occur, as is the case of photoresist shape 8b, not entirely protecting silicon oxide layer 7, overlying shallow trench 5. This is shown schematically in FIG. 3b. For the case of misalignment of photoresist shape 8b, to shallow trench 5, a dry etching procedure used to remove silicon oxide 7, from the top surface of silicon nitride layer 3, may result in a gouging or unwanted removal of silicon oxide 7, from the unprotected shallow trench region, resulting in an non-planarized insulator filled shallow trench. To overcome the misalignment situation, a dry etching procedure is used, featuring a monitoring procedure, indicating when between about 100 to 500 Angstroms of silicon oxide 7, still remains on the top surface of silicon nitride layer 3. At this point the unwanted gouging or removal of silicon oxide layer 7, from inside the insulator filled shallow trench, which would have occurred with the misaligned photoresist shape 8b, and complete removal, and an overetch cycle, of silicon oxide layer 7, has not yet occurred. FIGS. 4a and 4b, schematically show the status of the planarization process, using the properly aligned photoresist shape 8a, in FIG. 4a, and using the misaligned photoresist shape 8b, in FIG. 4b. The dry etchant chemistry used to remove all but about 100 to 500 Angstroms of silicon oxide 7, from silicon nitride layer 3, is $C_2F_6$—Ar.

Figure 5:
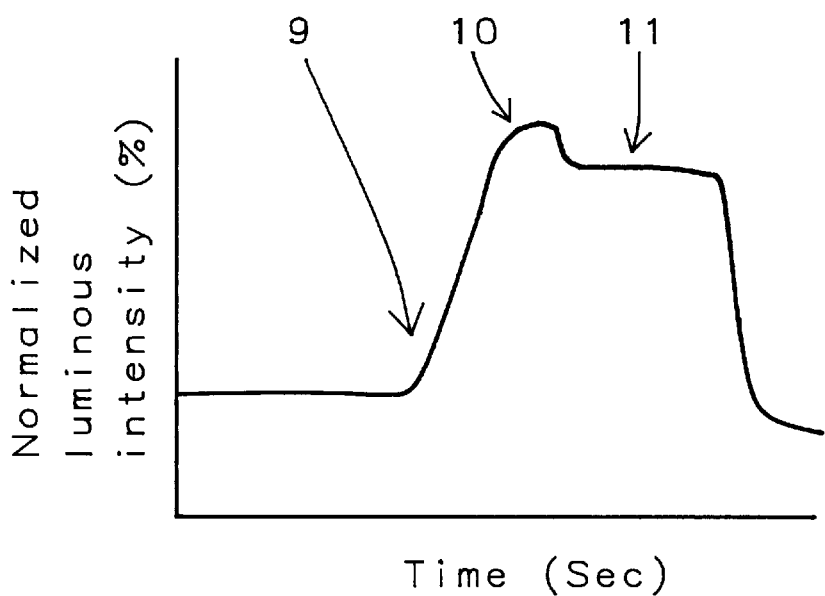
FIG. 5, which graphically shows a trace, used to determine the stage of the insulator removal procedure, featuring the amount of luminous intensity, or the amount of CN by-product, as a function of dry etch time.

The monitoring procedure, by optical emission spectroscopy, used to determine the presence of between about 100 to 500 Angstroms of silicon oxide layer 7, on silicon nitride layer 3, during the dry etching procedure, is summarized in the trace shown in FIG. 5. Luminous intensity, or the amount of CN by-product, monitored on the Y axis, is used to indicate the presence of nitrogen in the etch chamber, indicating silicon oxide 7, removal. Point 9, in FIG. 5, prior to the increase in luminous intensity, or CN product, still indicates between about 700 to 1000 Angstroms of silicon oxide 7, on a silicon nitride layer of about 1700 Angstroms. Continued dry etching, results in point 10, in which between about 100 to 500 Angstroms of silicon oxide 7, still remains on about 1700 Angstroms of silicon nitride 3. At this point the dry etching procedure is terminated, to be followed by photoresist removal and a CMP procedure. However if dry etching were continued, point 11, indicating the unwanted result of 0 Angstroms of silicon oxide layer 7, and about 900 Angstroms of silicon nitride 3, would result.

Figure 6:
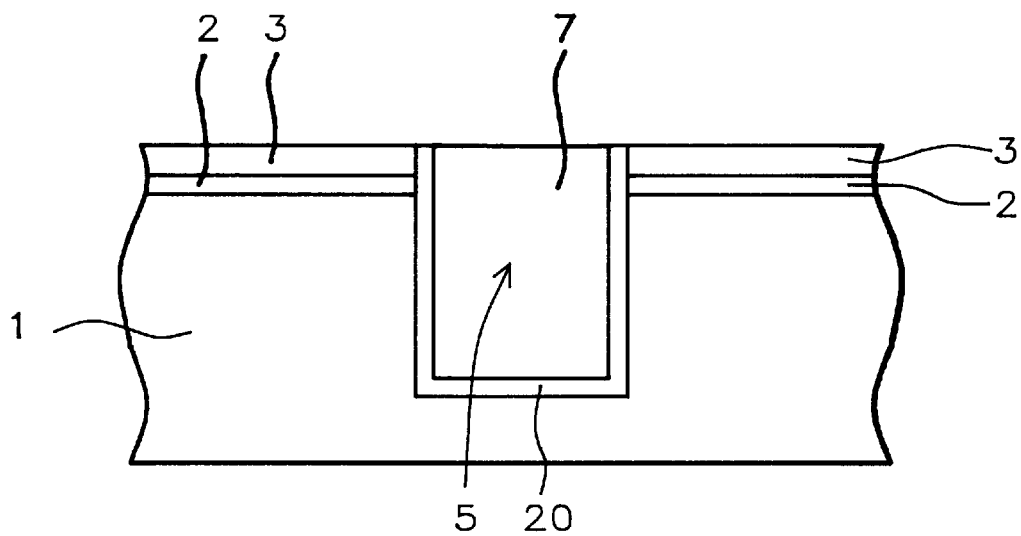
FIG. 6, which schematically, in cross-sectional style, shows the planarized, insulator filled trench, after a chemical mechanical polishing procedure.

After removal of photoresist shape 8a, or photoresist shape 8b, via plasma oxygen ashing and careful wet cleans, a CMP procedure is used to remove the portion of silicon oxide layer 7, overlying the insulator filled shallow trench, previously protected by photoresist shape 8a, or 8b, during the dry etching procedure, as well as removing the 100 to 500 Angstroms of silicon oxide 7, which remained on silicon nitride layer 3, after the dry etch procedure. A planarized insulator filled shallow trench, schematically shown in FIG. 6, results, even though photoresist shape 8b, was misaligned to the shallow trench. This was made possible by the ability to terminate silicon oxide dry etching, prior to exposing underlying silicon nitride, using the novel monitoring procedure described in this invention.

While this invention has been particularly shown and described with reference to, the preferred embodiments thereof, it will be understood by those skilled in the art that various changes in form and details may be made without departing from the spirit and scope of this invention.

What is claimed is:

1. A method of forming a planarized, insulator filled shallow trench, in a semiconductor substrate, comprising the steps of:

forming a shallow trench in a silicon nitride layer, in a pad silicon oxide layer, and in said semiconductor substrate, via trench dry etching procedures, using a first photoresist shape as a mask;

forming an insulator trench liner, on exposed surfaces of said semiconductor substrate, in said shallow trench;

depositing an insulator layer, resulting in a first portion of said insulator layer, on the top surface of said silicon nitride layer, and resulting in a second portion of said insulator layer, overlying a completely insulator filled, said shallow trench;

forming a second photoresist shape on a region of said second portion of said insulator layer, overlying said shallow trench;

removing part of said first portion of said insulator layer, from the top surface of said silicon nitride layer, via a planarizing dry etching procedure, in regions not protected by said second photoresist shape, using a dry etching monitoring procedure, allowing between about 100 to 500 Angstroms of said first portion of said insulator layer to be detected, and left remaining on the top surface of said silicon nitride layer;

removing said second photoresist shape; and removing said second portion of said insulator layer, overlying said insulator filled shallow trench, and removing remaining said first portion of said insulator layer, on the top surface of said silicon nitride layer, via chemical mechanical polishing procedures, creating said planarized, insulator filled shallow trench.

2. The method of claim 1, wherein said silicon nitride layer is deposited using LPCVD or PECVD procedures, to a thickness between about 1000 to 2000 Angstroms.

3. The method of claim 1, wherein said first photoresist shape as a mask to create said shallow trench, and used to protect subsequent active device regions from the shallow trench patterning procedure.

4. The method of claim 1, wherein said shallow trench is formed using said trench dry etching procedure, using $CHF_3$—$CF_4$—$Ar$—$O_2$ as an etchant for said silicon nitride layer, and as an etchant for said pad silicon oxide layer, while using $HBr$—$Cl_2$ as an etchant for said semiconductor substrate.

5. The method of claim 1, wherein said shallow trench is formed to a depth between about 3000 to 4000 Angstroms, in said semiconductor substrate, and formed with a width between about 4000 to 5000 Angstroms.

6. The method of claim 1, wherein said insulator layer, used to fill said shallow trench, is silicon oxide, deposited using LPCVD, PECVD, or SACVD procedures, to a thickness between about 5000 to 7000 Angstroms.

7. The method of claim 1, wherein said second photoresist shape is used to protect said second portion of said insulator layer, overlying said shallow trench, during said planarizing dry etching procedure, with said second photoresist shape comprised of the reverse tone of said first photoresist shape.

8. The method of claim 1, wherein part of said first portion, of said insulator layer, on said silicon nitride layer, is removed using said planarizing dry etching procedure, using $C_2F_6$—$Ar$ as an etchant, to a level in which between about 100 to 500 Angstroms of said first portion of said insulator layer remains on said silicon nitride layer.

9. The method of claim 1, wherein said dry etching monitoring procedure, used to detect between about 100 to 500 Angstroms of said first portion of said insulator layer, is performed using a CN by-product as indicator.

10. The method of claim 1, wherein said second portion of said insulator layer, overlying insulator filled shallow trench, and the remaining first portion of said insulator layer, on said silicon nitride layer, are removed via a CMP procedure, resulting in said planarized, insulator filled shallow trench.

11. A method of forming a planarized, silicon oxide filled shallow trench, in a semiconductor substrate, using a hybrid planarization procedure, with an initial dry etching cycle, performed using an endpoint monitoring procedure, enabling thin layers of silicon oxide, on underlying silicon nitride, to be detected, and than removed using a final chemical mechanical polishing cycle, comprising the steps of:

growing a pad insulator layer on said semiconductor substrate;

depositing a silicon nitride layer on said pad insulator layer;

forming a first photoresist shape, with an opening exposing a region of the top surface of said silicon nitride layer;

performing a trench dry etching procedure, in said opening, in said first photoresist shape, forming a shallow trench in said silicon nitride layer, in said pad insulator layer, and in said semiconductor substrate;

removal of said first photoresist shape;

growing an insulator trench liner on the exposed surfaces of said semiconductor substrate, in said shallow trench;

depositing a silicon oxide layer, completely filling said shallow trench, resulting in a first portion of said silicon oxide layer, on the top surface of said silicon nitride layer, and a second portion of said silicon oxide layer, overlying said completely filled shallow trench;

forming a second photoresist shape on said second portion of said silicon oxide layer, exposing said first portion of said silicon oxide layer, with said second photoresist shape having the dimension of said opening, in said first photoresist shape;

performing said initial dry etching cycle, of said hybrid planarization procedure, on a top part of said first portion of said silicon oxide layer, leaving between about 100 to 500 Angstroms of said first portion of said insulator layer, on said silicon nitride layer, using said endpoint monitoring procedure to detect between about 100 to 500 Angstroms of said first portion, of said silicon oxide layer;

removing said second photoresist shape; and performing a chemical mechanical polishing procedure, to form said planarized, silicon oxide filled shallow trench, via removal of remaining 100 to 500 Angstroms of said first portion of said silicon oxide layer, and via removal of said second portion of said silicon oxide layer, on completely filled shallow trench.

12. The method of claim 11, wherein said silicon nitride layer is deposited using LPCVD, PECVD, or SACVD procedures, to a thickness between about 1000 to 2000 Angstroms.

13. The method of claim 11, wherein said shallow trench is formed in said silicon nitride layer, in said pad insulator layer, and in said semiconductor substrate, in regions exposed in said opening, in said first photoresist shape, and using $CHF_3$—$CF_4$—Ar—$O_2$ as an etchant for said silicon nitride layer, and as an etchant for said pad insulator layer, while using HBr—$Cl_2$ as etchant for said semiconductor substrate.

14. The method of claim 11, wherein said shallow trench is formed to a depth between about 3000 to 4000 Angstroms, in said semiconductor substrate, and formed with a width between about 4000 to 5000 Angstroms.

15. The method of claim 11, wherein said silicon oxide layer, used to completely fill shallow trench, and used for said first portion of said silicon oxide layer, and for said second portion of said silicon oxide, is deposited using LPCVD, PECVD or SACVD procedures, to a thickness between about 5000 to 7000 Angstroms.

16. The method of claim 11, wherein top part, of said first portion of said silicon oxide layer, is removed via said initial dry etching cycle, using $C_2F_6$—Ar as an etchant, in regions not protected by said second photoresist shape, leaving between about 100 to 500 Angstroms of said first portion, of said silicon oxide layer, remaining on said silicon nitride layer.

17. The method of claim 11, wherein said endpoint monitoring procedure, used for said initial dry etching cycle, is accomplished using the magnitude of a CN by-product signal, to indicate endpoint.

18. The method of claim 11, wherein said chemical mechanical polishing procedure, removes said second portion of said silicon oxide layer, overlying completely filled shallow trench, and removes remaining first portion of said silicon oxide layer, from the top surface of said silicon nitride layer, creating said planarized, silicon oxide filled shallow trench.

* * * * *